(12) United States Patent
Takasu

(10) Patent No.: US 11,894,364 B2
(45) Date of Patent: Feb. 6, 2024

(54) SEMICONDUCTOR DEVICE

(71) Applicant: ABLIC Inc., Tokyo (JP)

(72) Inventor: Hiroaki Takasu, Tokyo (JP)

(73) Assignee: ABLIC Inc., Nagano (JP)

( * ) Notice: Subject to any disclaimer, the term of this patent is extended or adjusted under 35 U.S.C. 154(b) by 108 days.

(21) Appl. No.: 17/572,653

(22) Filed: Jan. 11, 2022

(65) Prior Publication Data

US 2022/0238510 A1 Jul. 28, 2022

(30) Foreign Application Priority Data

Jan. 26, 2021 (JP) .................. 2021-009959

(51) Int. Cl.
*H01L 27/02* (2006.01)
*H01L 29/417* (2006.01)

(52) U.S. Cl.
CPC .... *H01L 27/0266* (2013.01); *H01L 29/41775* (2013.01)

(58) Field of Classification Search
CPC ........... H01L 27/0266; H01L 29/41775; H01L 29/42312; H01L 29/402; H01L 29/861; H01L 29/4238; H01L 29/42376; H01L 29/66477–6684; H01L 29/78–7926; H01L 23/60; H01L 29/1033–1054
See application file for complete search history.

(56) References Cited

U.S. PATENT DOCUMENTS

| 5,028,819 A * | 7/1991 | Wei ................ H03K 19/018571 |
| | | 326/119 |
| 10,662,990 B2 * | 5/2020 | Duggan .................. F16B 2/185 |
| 2012/0181611 A1 | 7/2012 | Akai |
| 2016/0233207 A1 | 8/2016 | Hashitani et al. |
| 2020/0401172 A1 * | 12/2020 | Richmond ............. H03K 17/74 |

FOREIGN PATENT DOCUMENTS

| JP | 2012146899 | 8/2012 |
| JP | 2016149528 | 8/2016 |

* cited by examiner

*Primary Examiner* — Shahed Ahmed
(74) *Attorney, Agent, or Firm* — JCIPRNET

(57) ABSTRACT

A semiconductor device has an off transistor (10) in which a gate electrode (3) and a source region (6) of an N-type MOS transistor are connected to a ground terminal and a drain region (5) is connected to an external signal terminal (100*b*). In the off transistor (10), the gate electrode (3) is extensively provided over a portion or entirety of the drain region (5) in addition to a channel region. A capacitance (C2) formed between the gate electrode (3) and the drain region (5) may be greater than a capacitance (C1) generated between the gate electrode (3) and a ground potential.

7 Claims, 6 Drawing Sheets

SEMICONDUCTOR DEVICE

CROSS-REFERENCE TO RELATED APPLICATION

This application claims the priority benefit of Japan application serial no. 2021-009959 filed on Jan. 26, 2021. The entirety of the above-mentioned patent application is hereby incorporated by reference herein and made a part of this specification.

BACKGROUND

Technical Field

The invention relates to a semiconductor device.

Description of Related Art

A semiconductor device may be provided with an electrostatic discharge (ESD) protection element for protecting internal elements from various surges, noise, etc., represented by ESD.

Examples of such ESD protection element include a diode element, a bipolar element, a thyristor element, etc., formed independently or parasitically. Among these elements, a so-called "off transistor" in which the drain of an N-type metal-oxide-semiconductor (MOS) transistor is connected to an external terminal and the gate and the source are connected to the ground and used in an OFF state is known. Such off transistor has the function to prevent the surges of static electricity from propagating in the internal elements and allow the surges to escape to a substrate, etc.

Various proposals have been made for such off transistor. For example, to improve the ESD protection property, in Japanese Laid-open No. 2012-146899, an off transistor to which a RC timer in which a resistance element and a capacitance element are connected in series is connected is proposed.

Besides, as ESD models relating to damages to semiconductor devices, a human body model (HBM) and a charged device model (CDM) classified from the perspective of surge waveforms, energy, time, etc., are known.

HBM is a model characterizing discharging from a charged human being to a semiconductor device, where a relatively large energy is discharged to a semiconductor device in a few tens of nsec to a few hundreds of nsec. Meanwhile, due to the reduction of processes in which semiconductor devices are touched by human beings because of the automation in manufacturing processes in recent years, CDM has been drawing more attention than HBM. CDM is a model characterizing discharging through contacting a device or a metal part, such as a jig tool, from a terminal of a charged semiconductor device, where a relatively small amount of energy is discharged in an extremely short time such as several tens of psec to several hundreds of psec.

Thus, in CDM, a severe transient phenomenon occurs and if a large potential difference is generated between a gate electrode and a drain region in an off transistor, such potential difference may lead to destruction.

SUMMARY

An embodiment of the present invention provides a semiconductor device. The semiconductor device has an off transistor in which a gate electrode and a source region of a MOS transistor are connected to a first power terminal or a second power terminal, and a drain region is connected to an external signal terminal. In the off transistor, the gate electrode is extensively provided over a portion or entirety of the drain region in addition to a channel region. A capacitance forming region is provided between the drain region and the gate electrode extensively provided over the drain region.

DESCRIPTION OF THE EMBODIMENTS

An aspect of the present invention provides a semiconductor device in which a gate insulation film of an off transistor is not easily damaged by static electricity.

In the following, embodiments of the present invention will be described in detail with reference to the drawings.

First Embodiment

Figure 1:
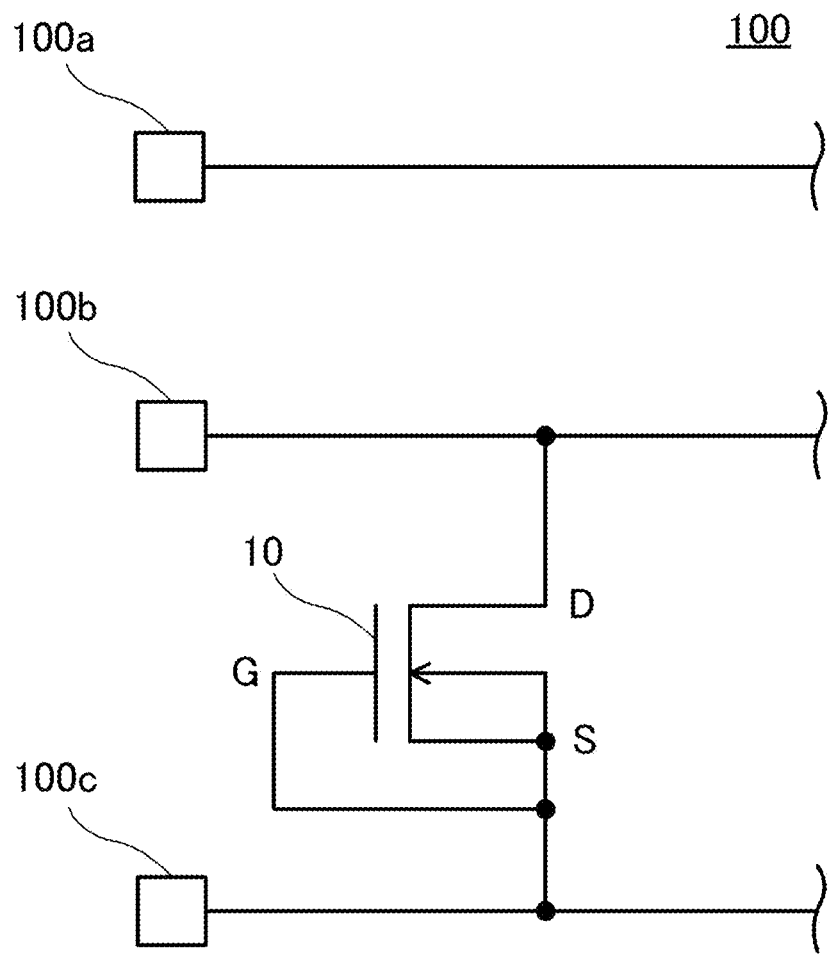
FIG. 1 is a circuit diagram of an off transistor provided in a semiconductor device according to a first embodiment.

FIG. 1 is a circuit diagram of an off transistor provided in a semiconductor device according to a first embodiment.

As illustrated in FIG. 1, a semiconductor device 100 has a first power terminal 100*a* at a power potential, an external signal terminal 100*b* into which a control signal turning on/off the semiconductor device 100 is input, a second power terminal 100*c* at a ground potential, and an off transistor 10.

In the embodiment, the control signal turning on/off the semiconductor device 100 is input to the external signal terminal 100*b*. However, the present invention is not limited thereto, and the signal may also be other signals.

The off transistor 10 is an N-type MOS transistor in the embodiment, a drain terminal D is connected to the external signal terminal 100*b*, and a gate terminal G and a source terminal S are connected to the second power terminal 100*c* at the ground terminal.

Figure 2:
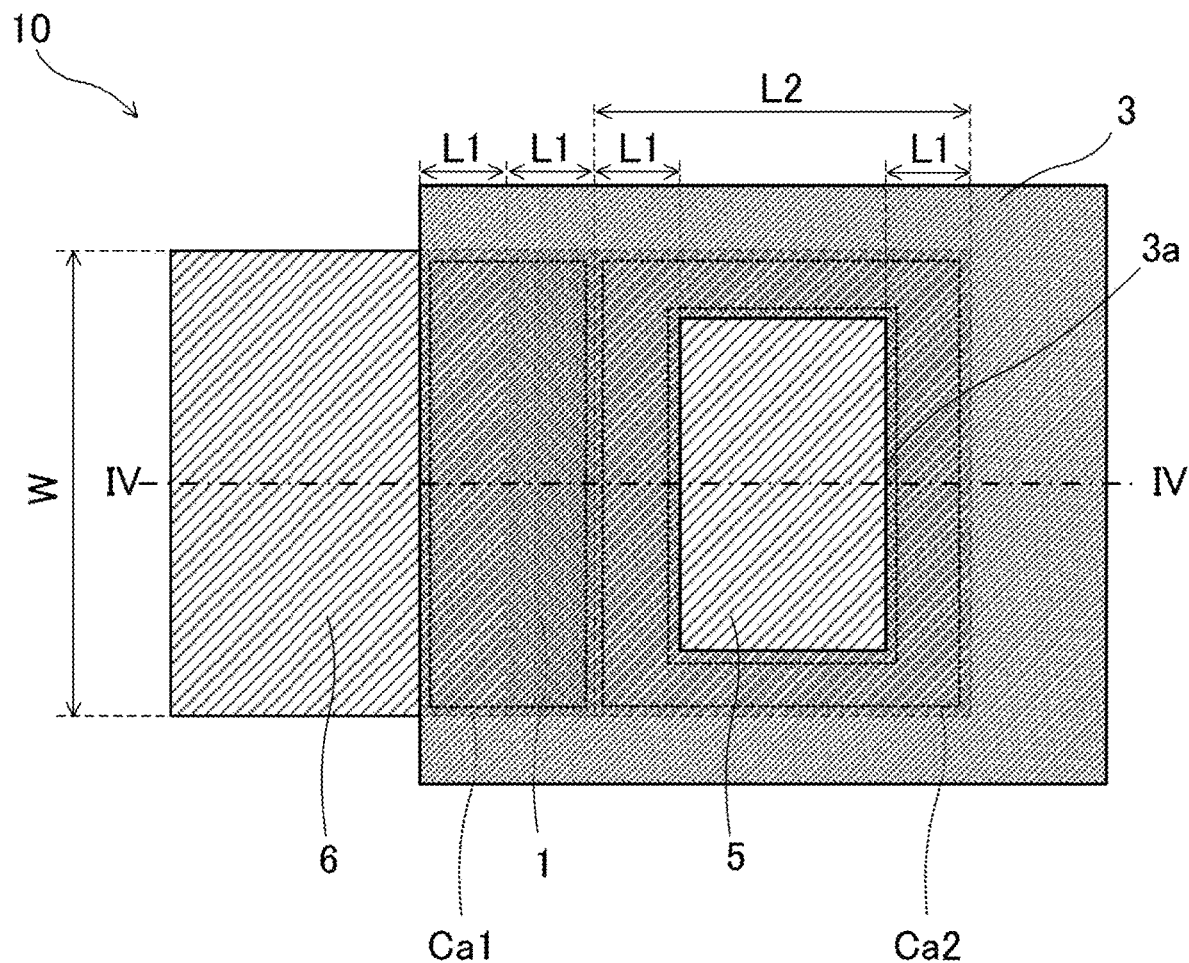
FIG. 2 is a schematic plan view of the off transistor according to the first embodiment.
Figure 3:
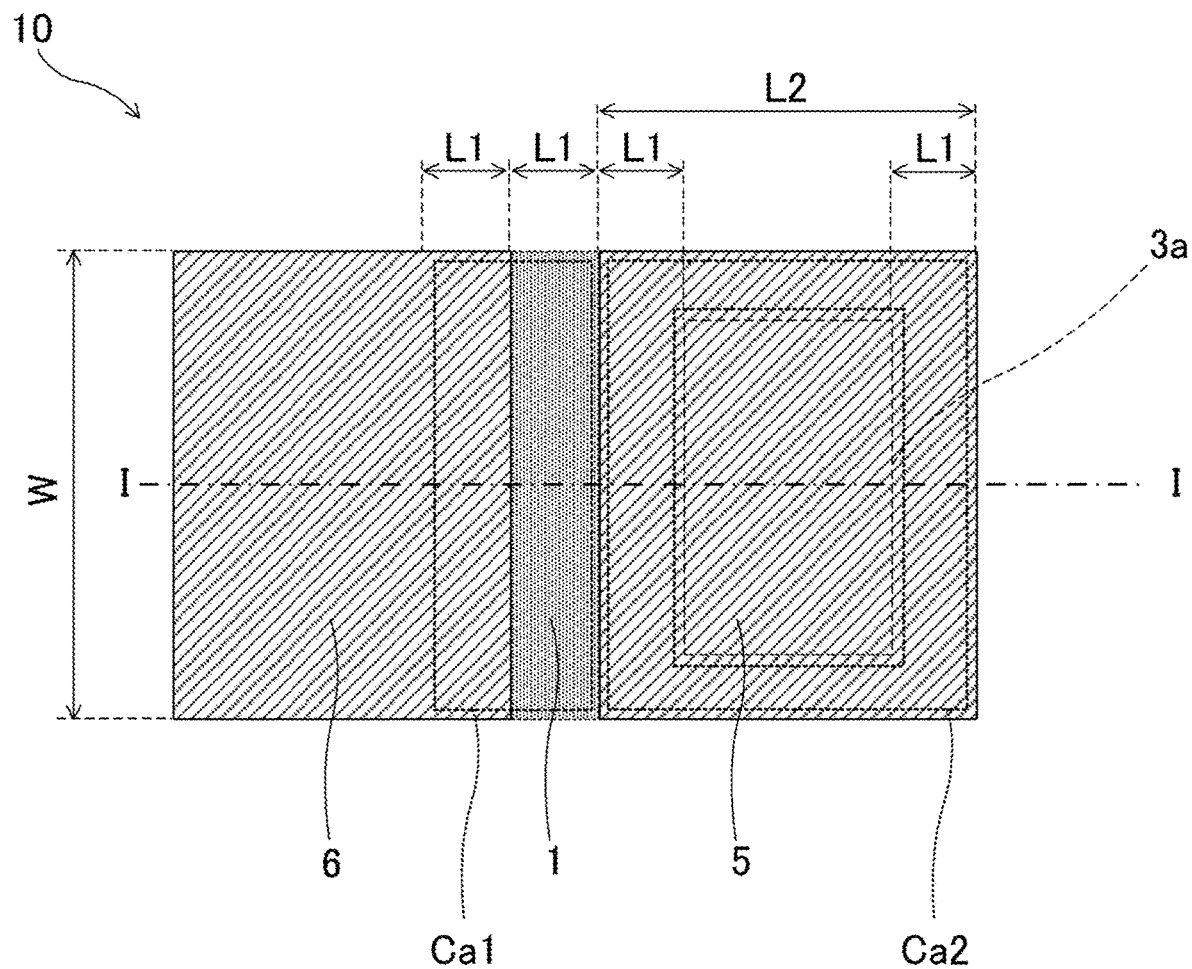
FIG. 3 is a schematic plan view of the off transistor in FIG. 2 with the gate electrode removed.
Figure 4:
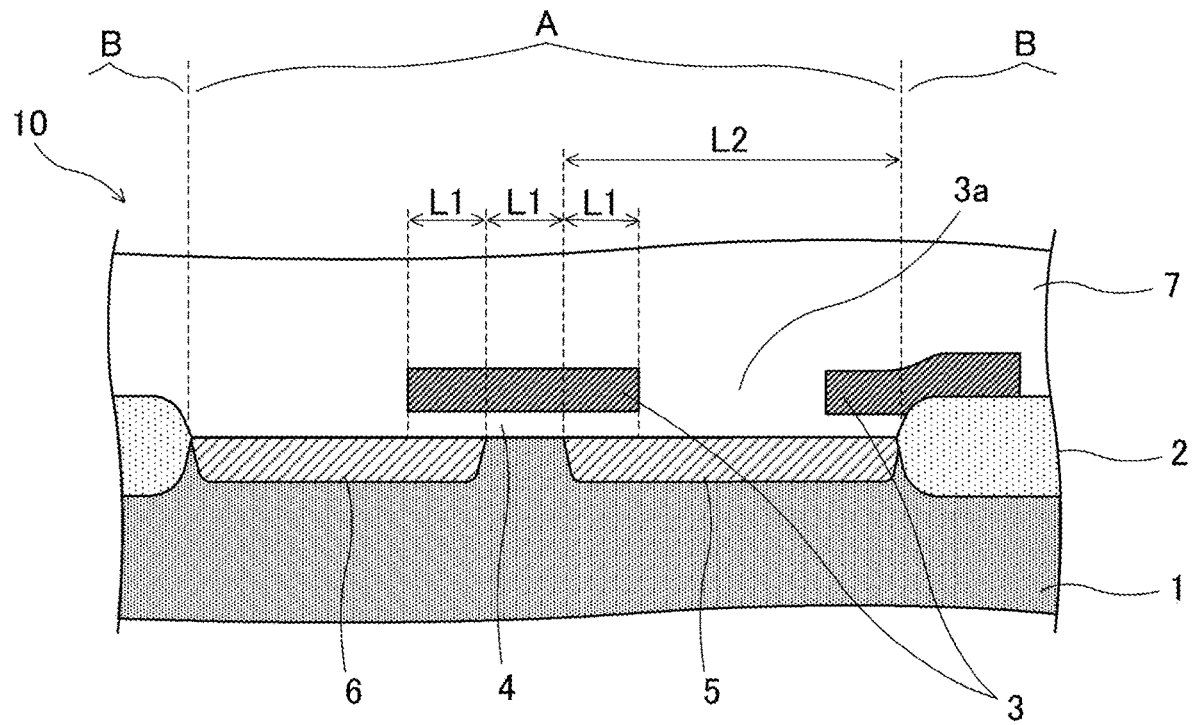
FIG. 4 is a schematic cross-sectional view taken along a line IV-IV illustrated in FIG. 2.

FIG. 2 is a schematic plan view of the off transistor according to the first embodiment. FIG. 3 is a schematic plan view of the off transistor in FIG. 2 with the gate electrode removed. FIG. 4 is a schematic cross-sectional view taken along a line IV-IV illustrated in FIG. 2. It is noted that the semiconductor device is not particularly limited, and may be appropriately chosen based on purposes. Examples of the semiconductor device include semiconductor devices with functions of a regulator, a sensor, a memory, battery control etc.

As illustrated in FIG. 4, the off transistor 10 is formed on an active region A of a surface of a silicon semiconductor substrate, and is formed by structurally combining a well region 1, an isolation oxide film 2, a gate electrode 3, a gate insulation film 4, a drain region 5, a source region 6, and an interlayer insulation film 7.

The active region A is electrically isolated from other elements through an element isolation region B.

The well region 1 is a region in which a P-type dopant is implanted on a surface of the silicon semiconductor substrate.

The isolation oxide film 2 is a local oxidation of silicon (LOCOS) film, and is formed on the surface of the silicon substrate on the periphery of the off transistor 10. The element isolation region B is formed by the isolation oxide film 2.

The element isolation region B may be formed by one using the LOCOS film as the isolation oxide film 2, like the embodiment, and may also be formed by shallow trench isolation (STI).

The gate electrode 3 is an electrode formed by forming a polysilicon film on the gate insulation film 4 formed on the well region 1 and implanting an N-type dopant into the polysilicon film. The gate electrode 3 covers not only the well region 1 (so-called channel region) between the drain region 5 and the source region 6 but also a portion of the drain region 5 and a portion of the source region 6 via the gate insulation film 4. Moreover, in the gate electrode 3, an opening 3a is provided above the drain region 5, so that the drain region 5 is electrically connectible with respect to a terminal part provided on the surface of the semiconductor device via a contact hole by using a conductive body, such as aluminum. The interlayer insulation film 7 is formed on a layer upper of the gate electrode 3.

The drain region 5 and the source region 6 are regions where N-type dopants are implanted, at a high concentration, on the surface of the well region 1.

The N-type dopants of the drain region 5 and the source region 6 are implanted into the periphery of the gate electrode 3 from the substantially normal direction of the surface of the silicon semiconductor substrate through ion implantation, and then the dopants are also diffused to the lower surface of the gate electrode 3 by a thermal treatment in the manufacturing process of the semiconductor device. Thus, in plan view of the silicon semiconductor substrate from the normal direction thereof, in the drain region 5 and the source region 6, there are portions located directly below the outer periphery part of the gate electrode 3.

In addition, the drain region 5 is connected to the external signal terminal 100b via the drain terminal D. The source region 6 is connected to the second power terminal 100c via the source terminal S and is set to the ground potential. In addition, the ground potential is also set in the well region 1.

Accordingly, since the well region 1, the drain region 5, and the source region 6 are present directly below the gate electrode 3 via the gate insulation film 4, capacitances are formed respectively.

Here, since the well region 1 and the source region 6 are at the ground potential, the capacitance formed with respect to the gate electrode 3 is common. Thus, as illustrated in FIGS. 2 and 3, a capacitance forming region Ca1 in a rectangular shape in plan view is formed between the gate electrode 3 and the well region 1 as well as the source region 6. In addition, between the gate electrode 3 and the drain region 5, a capacitance forming region Ca2 which is in a rectangular shape in plan view and in which the opening 3a is provided in the vicinity of the center thereof is formed.

Accordingly, in the off transistor 10, by forming the capacitance forming region Ca2 between the gate electrode 3 and the drain region 5, even if a transient potential change occurs between the gate and the drain due to ESD in CDM, for example, it is still easy for the potential of the gate electrode 3 to follow the potential of the drain region 5. Thus, it is not easy to generate a potential difference between the gate electrode 3 and the drain region 5, and the gate insulation film 4 is not damaged easily.

In addition, if a capacitance C2 by the capacitance forming region Ca2 is greater than a capacitance C1 by the capacitance forming region Ca1, that is, if the following equation C2>C1 is satisfied, the potential of the gate electrode 3 is easier to follow the potential of the drain region 5 than the ground potential. Accordingly, it is not easy to generate a potential difference between the gate electrode 3 and the drain region 5, and can further suppress the damage to the gate insulation film 4.

Specifically, in the case of a conventional transistor, the case where the length (L1+L1+L1) of the gate electrode 3 is set as 3 μm, a width W of the gate electrode 3 is set as 100 μm, the lengths of diffusion of the drain region 5 and the source region 6 below the gate electrode 3 are each set as L1 (i.e., 1 μm), and the gate electrode 3 is not extended is considered. In such case, it is known that the area ratio between the capacitance forming region Ca1 and the capacitance forming region Ca2 becomes (2 μm×100 μm×film thickness of the gate insulation film 4):(1 μm×100 μm×film thickness of the gate insulation film 4), i.e., 2:1. By doing so, it is easier for the potential of the gate electrode 3 to follow the ground potential than the potential of the drain region 5.

Thus, in the off transistor 10 of the embodiment, as illustrated in FIG. 2, the area of the capacitance forming region Ca2 is 2 times or more of the capacitance forming region Ca1. Thus, it is easy for the potential of the gate electrode 3 to follow the potential of the drain region 5. As a result, it is not easy to generate a potential difference between the gate electrode 3 and the drain region 5, and the damage to the gate insulation film 4 can be further suppressed.

In the case where it is not necessary to extend the drain region 5 to a portion in contact with the element isolation region B, the gate electrode 3 may be widened, and the element isolation region B and the drain region 5 may be separated from each other.

Moreover, a region having a P-type dopant concentration higher than the well region 1, which is formed below the element isolation region B and serves as a channel stopper, may be intentionally distanced from the drain region 5 to avoid contact and arranged as a high breakdown voltage structure. Accordingly, it is possible to significantly increase the capacitance forming region Ca2 between the gate electrode 3 and the drain region 5.

Second Embodiment

Figure 5:
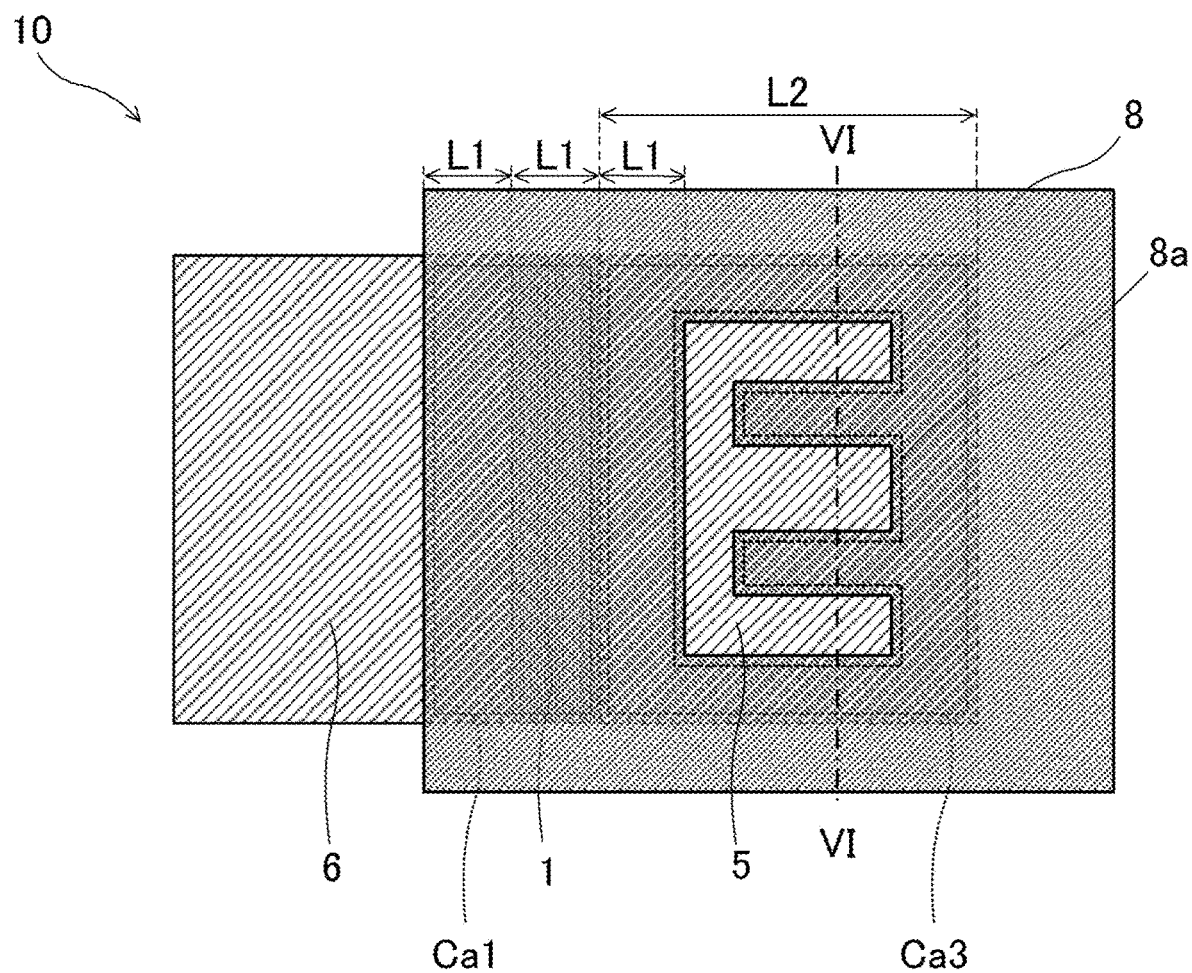
FIG. 5 is a schematic plan view of an off transistor provided in a semiconductor device according to a second embodiment.
Figure 6:
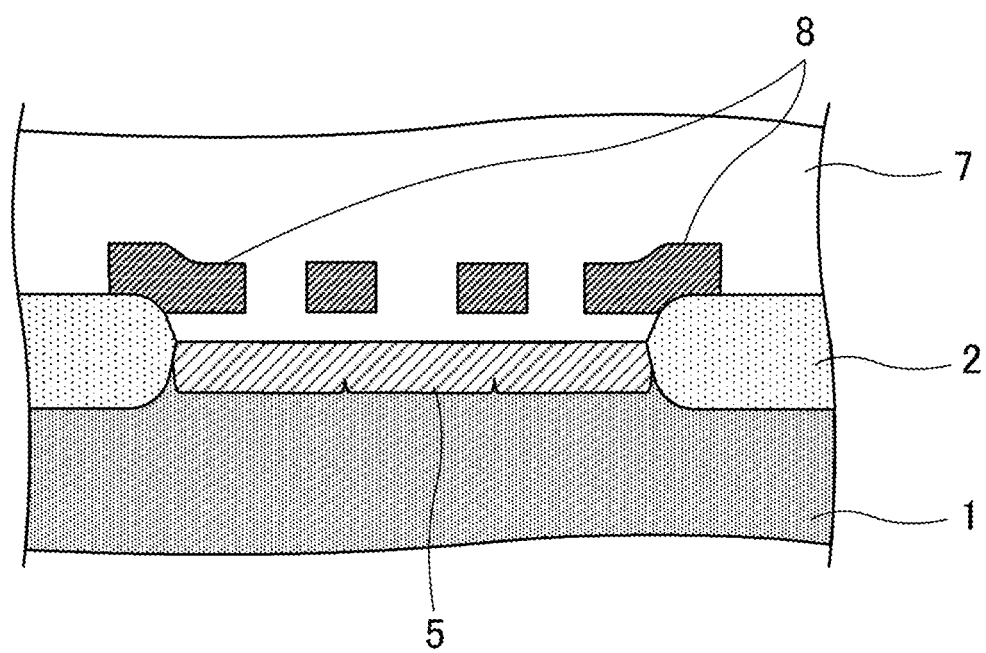
FIG. 6 is a schematic cross-sectional view taken along a line VI-VI illustrated in FIG. 5.

FIG. 5 is a schematic plan view of an off transistor provided in a semiconductor device according to a second embodiment. FIG. 6 is a schematic cross-sectional view taken along a line VI-VI illustrated in FIG. 5.

As illustrated in FIGS. 5 and 6, except for a difference that the shape of the opening 3a of the first embodiment in plan view is changed to an opening 8a in a comb shape, the second embodiment is the same as the first embodiment. Thus, regarding the configuration same as the first embodiment having been described with reference to FIGS. 2 to 4, the same reference symbols are used and repeated descriptions are omitted.

In the second embodiment, by making the opening 8a comb-shaped, compared with the first embodiment, an area of a capacitance forming region Ca3 formed between the gate electrode 8 and the drain region 5 can be greater than the area of the capacitance forming region Ca1. Thus, since it is easier for the potential of the gate 8 to follow the potential of the drain region 5 than the case of Embodiment 1, it is even harder to generate a potential difference between the gate electrode 3 and the drain region 5, and the damage to the gate insulation film 4 can be further suppressed.

In addition, if the opening 8a is comb-shaped, it is easier to implant dopants to the surface of the well region 1 at the time of forming the drain region 5 and the source region 6.

Although two recess parts of the gate electrode are provided in X-direction in the opening in the second embodiment, the present invention is not limited thereto. The number of recess parts, the orientation thereof, the width thereof, etc., can be set arbitrarily. That is, from the perspective of increasing the area of the capacitance forming region Ca3, the shape of the opening, in plan view, may have a recess part in a portion of a rectangular shape. The recess part may be provided so that a corner part of the opening in a rectangular shape is chipped.

As described above, in the semiconductor device having the off transistor in which the gate and the source of an N-type MOS transistor are grounded, the gate electrode of the off transistor is extensively provided over a portion or the entirety of the drain region in addition to the channel region. Thus, in the off transistor, it is easy for the potential of the gate electrode to follow the potential of the drain region 5 and, as a consequence, it is not easy to generate a potential difference between the gate electrode and the drain region, and the damage to the gate insulation film can be suppressed.

Although the embodiments of the present invention have been described in detail above, the present invention is not limited to these embodiments, and includes designs and the like within a range that does not deviate from the gist of the present invention.

In the first and second embodiments, the opening is provided in the gate electrode for being electrically connectible with respect to the terminal part provided on the surface of the semiconductor device from the drain region via a contact hole, the opening may also be omitted if it is possible to build a connection from another passage.

In addition, in the first and second embodiments, the off transistor is N-type and the well region is P-type. However, the present invention is not limited thereto. The off transistor may also be P-type, and the well region may be N-type. In such case, in the off transistor, the gate electrode and the source region of the P-type MOS transistor are connected to the first power terminal, and the gate electrode is extensively provided over a portion or the entirety of the source region in addition to the channel region.

In addition, the external signal terminal described above is set as a terminal to which an external signal is input. However, the same applies to any terminal to which static electricity is applied. For example, a power terminal to which a power voltage known as a first power or a second power is applied may also serve as a terminal to which static electricity is applied.

It will be apparent to those skilled in the art that various modifications and variations can be made to the disclosed embodiments without departing from the scope or spirit of the present invention. In view of the foregoing, it is intended that the present invention covers modifications and variations provided that they fall within the scope of the following claims and their equivalents.

What is claimed is:

1. A semiconductor device, comprising:
   an off transistor in which a gate electrode and a source region of a MOS transistor are connected to a first power terminal or a second power terminal, and a drain region is connected to an external signal terminal,
   wherein in the off transistor, the gate electrode is extensively provided over a portion or entirety of the drain region in addition to a channel region, and
   a capacitance formed between the gate electrode and the drain region is greater than a capacitance generated between the gate electrode and a ground potential.

2. The semiconductor device according to claim 1, wherein the gate electrode is provided with an opening at a place covering the drain region.

3. The semiconductor device according to claim 2, wherein a shape of the opening is a rectangular shape in plan view.

4. The semiconductor device according to claim 3, wherein the shape of the opening in plan view has a recess part in a portion of the rectangular shape.

5. The semiconductor device according to claim 1, wherein the gate electrode is provided with an opening at a place covering the drain region.

6. The semiconductor device according to claim 5, wherein a shape of the opening is a rectangular shape in plan view.

7. The semiconductor device according to claim 6, wherein the shape of the opening in plan view has a recess part in a portion of the rectangular shape.

* * * * *